United States Patent
Theuss

(10) Patent No.: US 6,987,312 B2
(45) Date of Patent: Jan. 17, 2006

(54) SEMICONDUCTOR DEVICE WITH SENSOR AND/OR ACTUATOR SURFACE AND METHOD FOR PRODUCING IT

(75) Inventor: Horst Theuss, Wenzenbach (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/912,045

(22) Filed: Aug. 6, 2004

(65) Prior Publication Data

US 2005/0046044 A1 Mar. 3, 2005

Related U.S. Application Data

(63) Continuation of application No. PCT/DE03/00334, filed on Feb. 6, 2003.

(30) Foreign Application Priority Data

Feb. 7, 2002 (DE) ................................ 102 05 127

(51) Int. Cl.
H01L 23/02 (2006.01)
(52) U.S. Cl. ...................... 257/680; 438/116; 438/106
(58) Field of Classification Search ................ 257/680, 257/678, 701; 438/116, 106
See application file for complete search history.

(56) References Cited

U.S. PATENT DOCUMENTS 4,894,707 A 1/1990 Yamawaki et al.
6,100,595 A 8/2000 Jaouen et al.
6,227,724 B1 5/2001 Verdiell
6,229,190 B1 5/2001 Bryzek et al.
6,316,840 B1 11/2001 Otani
2001/0048064 A1 12/2001 Kitani

FOREIGN PATENT DOCUMENTS

| DE | 19826426 A1 | 12/1999 |
| DE | 19854396 A1 | 6/2000 |
| EP | 0789334 B1 | 8/1997 |
| EP | 19626082 A1 | 1/1998 |
| EP | 1041628 A2 | 10/2000 |
| EP | 1246235 A1 | 10/2002 |
| JP | 2000214034 A | 8/2000 |
| JP | 2000249611 A | 9/2000 |
| JP | 2001004473 A | 1/2001 |
| JP | 2001033666 A | 2/2001 |
| JP | 2001053332 A | 2/2001 |
| JP | 2001083370 A | 3/2001 |
| JP | 2002340849 A | 11/2002 |
| WO | WO 99/54762 A1 | 10/1999 |
| WO | WO 00/42405 | * 7/2000 |
| WO | WO 00/42405 A1 | 7/2000 |

* cited by examiner

Primary Examiner—Douglas W Owens
(74) Attorney, Agent, or Firm—Edell, Shapiro & Finnan, LLC

(57) ABSTRACT

An electronic semiconductor device includes a semiconductor chip, which has an active chip area enclosed by an elevated metal frame. A plastic housing has a cutout for the active chip area within the metal frame, which permits passage of signals to or from the active chip area.

15 Claims, 3 Drawing Sheets

SEMICONDUCTOR DEVICE WITH SENSOR AND/OR ACTUATOR SURFACE AND METHOD FOR PRODUCING IT

CROSS REFERENCE TO RELATED APPLICATIONS

This application is a continuation of PCT/DE03/00334, filed Feb. 6, 2003, and titled "Semiconductor Device Comprising a Sensor Surface or an Actuator Surface and Method for Producing the Same," which claims priority to German Application No. DE 102 05 127.5, filed on Feb. 7, 2002, and titled "Semiconductor Device Comprising a Sensor Surface or an Actuator Surface, and Method for Producing the Same," the entire contents of which are hereby incorporated by reference.

FIELD OF THE INVENTION

The invention relates to a sensor device having a sensor surface and/or an actuator surface and to a method for producing it.

BACKGROUND

Sensors for converting physical quantities into electrical signals are known in a wide variety of embodiments and structural sizes. If particularly small sensors are required, a realization in the form of a semiconductor device affords advantages. Also, semiconductor sensors can readily be integrated into a circuit periphery that may be situated on the same semiconductor substrate and enables an interconnection of the sensor.

In the case of semiconductor sensors, the active front side of the semiconductor chip often has to be uncovered in order to enable an error-free function if, for example, pressure values, sound oscillations of the air or other physical quantities are intended to be measured. Thus, particularly in the case of pressure sensors or in the case of sound sensors (microphones), it is necessary to ensure the oscillation capability of a diaphragm. The oscillations are then converted into electrical signals.

Other sensors, too, for example, for temperature or for detecting specific gases, require an uncovered sensor surface, under certain circumstances. The same applies to all kinds of optical sensors which can be used as transmitters and receivers. Thus, the optically effective sensor and/or actuator surfaces of laser devices, of LEDs and also of cameras (with a CCD sensor or the like) must enable unimpeded coupling-in and/or coupling-out of signals. In spite of this, high requirements are made of the reliability and, in particular, of the mechanical robustness of semiconductor devices of this type.

For the realization of sensor housings, consideration is given to lead frame technology in which a cavity is provided for the semiconductor chip. Examples thereof are "premolded packages" having a cover or a construction comprising a plurality of parts, which, during assembly, are joined together to form a cavity. In the case of optical housings, the configuration of the device must enable the exact coupling of an optical signal line, for example, of an optical fiber line. For this purpose, relatively complex plug connections outside the device housing, or, if appropriate, coupling/plug devices in the housing are provided.

Semiconductor devices with a pressure sensor and semiconductor devices with an optical sensor and with devices for coupling optical signals in or out are known.

A semiconductor device having a sensor surface and/or actuator surface, which is constructed in a simple manner and which can be produced simply and cost-effectively, and a simple method for producing such a semiconductor device, are desirable.

SUMMARY

An electronic semiconductor device has a semiconductor chip, which has at least one active chip area functioning as a sensor surface and/or one functioning as an actuator surface on an active front side. According to the invention, the active chip area is enclosed by an elevated metal frame. Furthermore, the semiconductor chip has contact areas on its active front side, which are grouped around the metal frame. A plastic housing of the semiconductor device has a cutout for the active chip area within the metal frame and leaves this free.

This electronic semiconductor device according to the invention enables signals to be coupled in and/or out to a sensor and/or actuator surface of the semiconductor chip through the cutout in the plastic housing. For this purpose, the housing may be provided with a suitable coupling-on location, for example, for connection to optical waveguides or the like.

In one embodiment, a metal frame has an annular form with a rectangular cross section. Such a ring may be electrodeposited and may be produced by a similar technique already available for the electrodeposition of contact bumps for flip-chip contact-connection of the semiconductor chip. In an embodiment of the semiconductor chip as flip-chip, the metal frame and/or the flip-chip contacts (balls, bumps) may be produced relatively simultaneously by a corresponding mask embodiment.

An alternative method for application of the metal frame and/or the contact bumps includes screen printing techniques. It is also possible to apply the metal frame first to the finished and then to the active front side of the semiconductor chip.

Preferably, a top side of the metal frame ends flush with a surface of a plastic housing. The material primarily taken into consideration for the housing is plastic molding composition that is processed by transfer molding methods. The semiconductor device is lined with the plastic molding composition and thus shielded and encapsulated against mechanical effects and against media influences.

A further embodiment of the electronic semiconductor device according to the invention provides for the semiconductor chip to be mounted by its active front side on a carrier substrate using flip-chip technology. The carrier substrate has a coupling-in location for sensor signals and/or a coupling-out location for actuator signals. The coupling-in and/or coupling-out location may be, in a first embodiment, a cutout in the carrier substrate that is situated directly below the active chip area and consequently enables an unimpeded signal propagation.

When using known front end technologies, mask technology may result in a high positioning accuracy, which may also satisfy stringent requirements made of the optical precision. Corresponding instances of optical coupling-on are thereby made possible. By using flip-chip technology, a galvanically applied ring or metal frame may be used directly for contact connection, i.e., for example, for soldering onto a printed circuit board. This ensures a hermetically sealed termination with respect to the carrier substrate or with respect to the printed circuit board and furthermore a protection of the remaining chip areas from ambient influences.

Alternatively, the semiconductor chip can be mounted by its passive rear side on a carrier substrate, which has contact pads that are electrically conductively connected by wire bonding connections to the contact areas on the active front side of the semiconductor chip. This embodiment according to the invention can be produced simply and cost-effectively by using the known wire bonding connection technique in this case.

For example, an optically sensitive area is taken into consideration as the active chip area, so that an optical sensor is involved in this case. The optically sensitive area may include either an individual optical component such as, e.g., a photo transistor or a photo diode. Also possible, however, are higher-resolution sensors including a multiplicity of photoelements connected together in matrix form, as is the case, e.g., with CCD cameras.

The active chip area may comprise an optically active surface region that can emit optical signals, e.g., in the form of laser beams. As an alternative, the active chip area may include an area that is sensitive to pressure or to sound oscillations. It may also include a temperature or gas-sensitive area. Such a gas sensor may react sensitively to individual specific gases or else to gas mixtures.

A method according to the invention for producing an electronic semiconductor device having a semiconductor chip, which has at least one active chip area functioning as a sensor surface and/or actuator surface on the active front side, includes providing a semiconductor chip having an active front side and an active chip area and contact areas grouped around the latter and having a passive rear side, applying an elevated metal frame around the active chip area, producing electrical connections between the contact areas of the semiconductor chip and contact pads of the semiconductor device, and applying a housing of the semiconductor device while leaving free external contacts and while leaving free the active chip area within the metal frame.

Such a method can be carried out in a simple and cost effective manner and enables the inexpensive production of sensor and/or actuator devices, which are based on semiconductor chips and can be used in a highly universal fashion. A usable wafer level package is available after fitting the annular coupling and the electrical contacts.

If necessary, for example, to meet elevated reliability requirements, it can be encapsulated by a plastic casing or other housings.

In accordance with one embodiment of the method according to the invention, the metal frame is applied to the active front side of the semiconductor chip galvanically. This method can be carried out simply and cost-effectively and yields reliable results.

The metal frame may be produced in a common process step together with contact bumps which are likewise applied galvanically to the contact areas of the semiconductor chip. The production method for the semiconductor devices can be further optimized in this way.

The contact bumps and the metal frame may have approximately the same height, so that the semiconductor chip can readily be mounted onto a front side of the carrier substrate. The metal frame can be fixedly connected thereto and provide a seal.

Instead of mounting the semiconductor chip on the carrier substrate using flip-chip technology, the electrical connections may also be produced using conventional wire bonding technology, which can be realized simply and cost-effectively.

BRIEF DESCRIPTION OF THE FIGURES

The invention will now be explained in more detail using embodiments with reference to the accompanying drawings.

DETAILED DESCRIPTION

Figure 1:
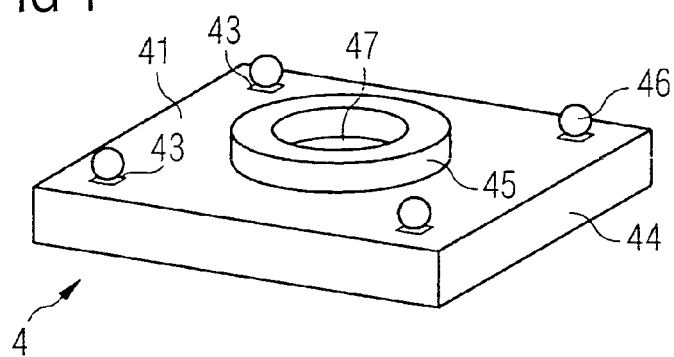
FIG. 1 shows a semiconductor chip in a diagrammatic perspective illustration.

FIG. 1 shows a semiconductor chip 4 in a diagrammatic perspective illustration. The semiconductor chip 4 has an active front side 41 having contact areas 43, on which contact bumps 46 are applied in each case in the illustration shown. Furthermore, an active chip area 47 is provided on the active front side 41 of the semiconductor chip 4. The active chip area can be arranged in a central region of the active front side 41.

The active chip area 47 may function as a sensor area and/or as an actuator area, depending on the desired embodiment of the electronic semiconductor device. In this case, the sensor may be, for example, an optical sensor, a pressure sensor, a sound sensor, a temperature sensor, or a gas sensor. An optical or acoustic transmitter, for example, is taken into consideration as an actuator. The active chip area 47 is surrounded by a metal frame 45, which, in the exemplary embodiment shown, has an annular form and projects in elevated fashion above the active front side 41 of the semiconductor chip 4. The metal frame 45, for instance, is approximately the height of the contact bumps 46, which facilitates its mounting on a carrier substrate or on a printed circuit board (cf. FIG. 2).

Figure 2:
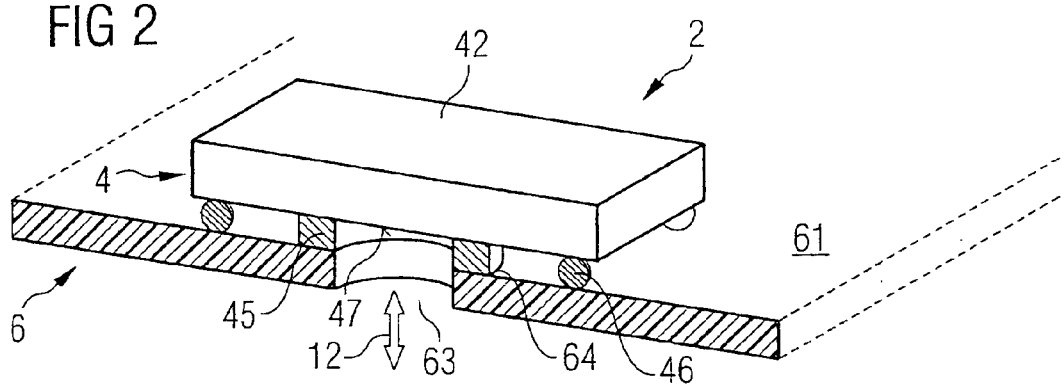
FIG. 2 shows a first embodiment of an electronic semiconductor device according to the invention in a diagrammatic perspective illustration.

FIG. 2 shows a diagrammatic perspective illustration of a first embodiment of an electronic semiconductor device 2 according to the invention, which includes a semiconductor chip 4 in accordance with FIG. 1 and also a flat carrier substrate 6, on which the semiconductor chip 4 is placed and mounted. The flat carrier substrate 6 has a first surface 61, on which the semiconductor chip 4 is mounted by its active front side 41 using flip-chip technology. For this purpose, the contact bumps 46 are applied to corresponding contact pads 66 (not illustrated) on the first surface 61 of the carrier substrate 6.

The metal frame 45 is placed on a correspondingly matching annular contact 64 framing a cutout 63 in the carrier substrate 6. The cutout forms a coupling-in and/or coupling-out location for sensor and/or actuator signals 12.

The signals 12 are indicated by a double arrow within the cutout 63. The arrow direction is perpendicular to the active chip area 47 and the active front side 41, and the first surface 61 also defines the direction of the actuator and/or sensor signals 12. The metal frame 45 is fixedly connected to the annular contact 64, so that, in a finished semiconductor device 2, the entire active front side 41 of the semiconductor chip 4 with the exception of its active chip area 47 is hermetically closed off with respect to signal and ambient influences.

The carrier substrate 6 may be, e.g., a conventional printed circuit board made of epoxide material or else a ceramic carrier or the like.

A plastic housing 10 that encapsulates at least the first surface 61 of the carrier substrate 6 and also the semiconductor chip 4 is not illustrated here, for the sake of better clarity.

Figure 3:
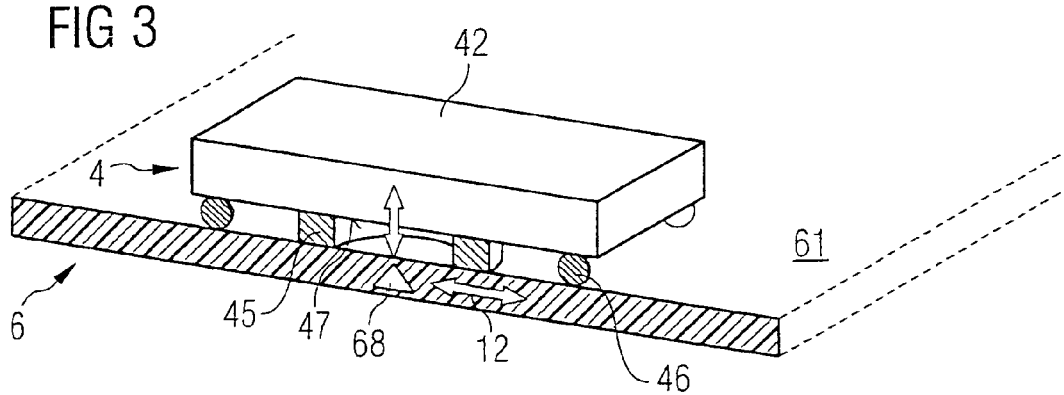
FIG. 3 shows a second embodiment of the electronic semiconductor device according to the invention in a diagrammatic perspective illustration.

FIG. 3 shows an alternative configuration of the electronic semiconductor device 2 in a perspective illustration, in which, instead of a cutout 63 leading vertically through the carrier substrate 6 directly beneath the active chip area 47, a deflection device 68 is provided in the carrier substrate 6 directly beneath the active chip area 47. The deflection device 68, which may include, e.g., in a mirror system for reflection of optical signals, effects deflection of the sensor and/or actuator signals 12 in the direction of a side area of the carrier substrate 6.

This deflection may be desirable for a variety of reasons, for example, in order to be able to realize a particularly flat semiconductor device 2 in which the coupling-in and/or coupling-out location for sensor and/or actuator signals 12 is provided at one of its flat side edges. In the case of the semiconductor device 2 shown in FIG. 3, too, the housing is not depicted for reasons of better clarity. The rest of the construction of the electronic semiconductor device 2 corresponds to that in accordance with FIG. 2.

Figure 4:
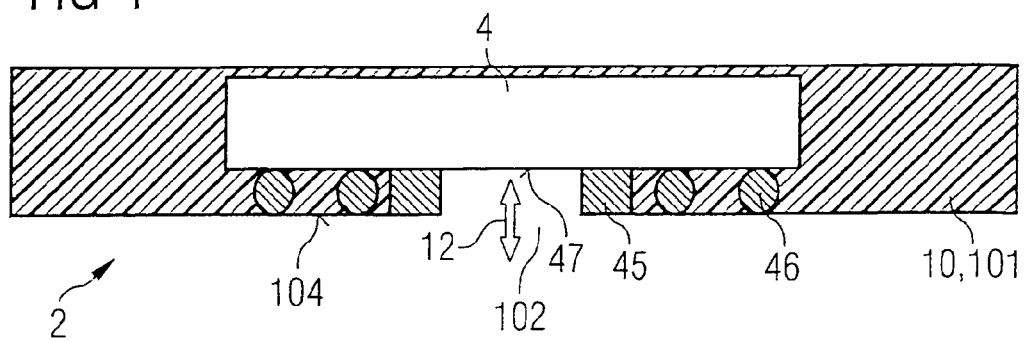
FIG. 4 shows the semiconductor chip of the semiconductor device in a diagrammatic sectional illustration.
Figure 5:
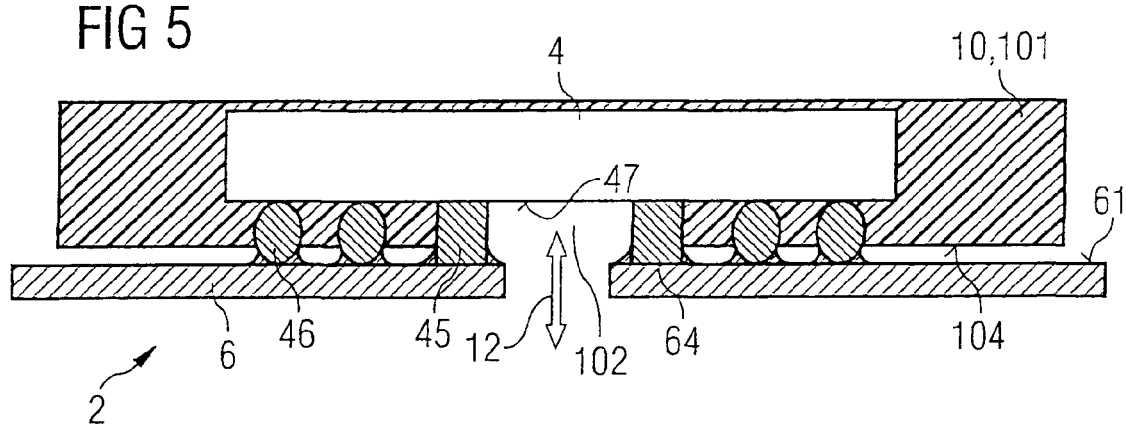
FIG. 5 shows the electronic semiconductor device mounted on a carrier in a diagrammatic sectional illustration.

FIG. 4 shows the semiconductor chip 4 of the electronic semiconductor device according to the invention in a diagrammatic sectional illustration. A carrier substrate has not yet been applied in this case. The finished semiconductor device is shown in FIG. 5. The semiconductor chip 4 and also the greatest parts of the contact bumps 46 are encapsulated by a plastic housing 10. The plastic housing 10, which, for instance, includes a molding composition 101 and may be applied by the transfer molding method, for example, adjoins the active front side of the semiconductor chip as far as the outer edge of the metal frame 45 and leaves free a sensor channel 102 within the metal frame 45, thereby enabling sensor or actuator signals 12 to be coupled in or out in an unimpeded manner to the active chip area 47.

Short segments of the approximately round contact bumps 46 project from the plastic housing 10, so that, to produce an electrically conductive connection, they can be placed on contact pads of the carrier substrate using flip-chip technology and be soldered thereto.

FIG. 5 shows a diagrammatic section of the electronic semiconductor device 2 in accordance with FIG. 4, which is applied to a carrier substrate 6. This illustration reveals the soldering connections of contact pads 66 of the carrier substrate 6 to the contact bumps 46 of the semiconductor chip 4 and to the metal frame 45, which bears on the annular contact 64 and is soldered thereto. The carrier substrate 6 has a cutout 63 that has approximately the same diameter as the inside of the metal frame 45 and enables sensor and/or actuator signals 12 to be coupled in and/or out in an unimpeded manner.

As can be discerned from FIG. 5, the plastic housing 10 may be finished before the device is placed onto the carrier substrate 6. This is illustrated by the narrow spacing between housing underside 104 and first surface 61 of the carrier substrate 6. However, it is also equally possible to effect the production of the connection between semiconductor chip 4 and carrier substrate 6 and the subsequent molding with a molding composition 101.

Figure 6:
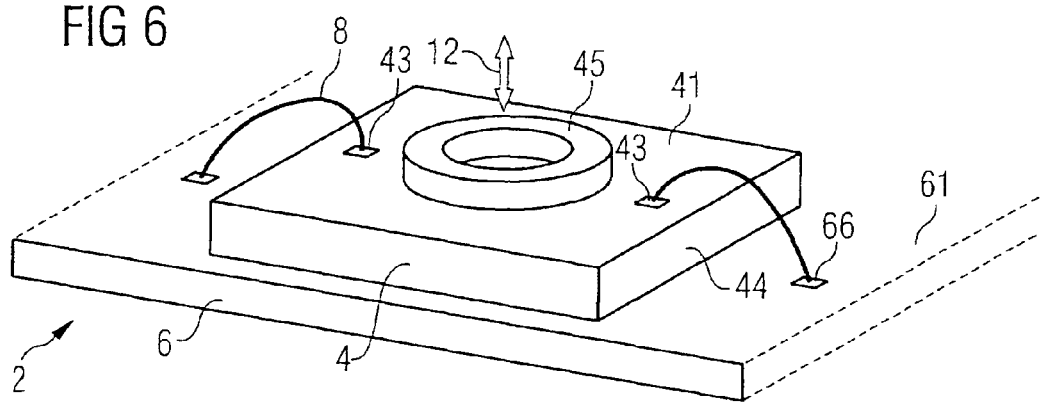
FIG. 6 shows a further alternative configuration of the electronic semiconductor device in a diagrammatic perspective view.

FIG. 6 shows a perspective diagrammatic illustration of an alternative embodiment of the electronic semiconductor device 2. In this case, the contact areas 43 of the semiconductor chip 4 are electrically conductively connected to the contact pads 66 of the carrier substrate 6 using conventional wire bonding technology. In this case, the semiconductor chip 4 is applied by its passive rear side 42 to the first surface 61 of the carrier substrate 6, so that the active chip area 47 faces away from the carrier substrate 6.

Figure 7:
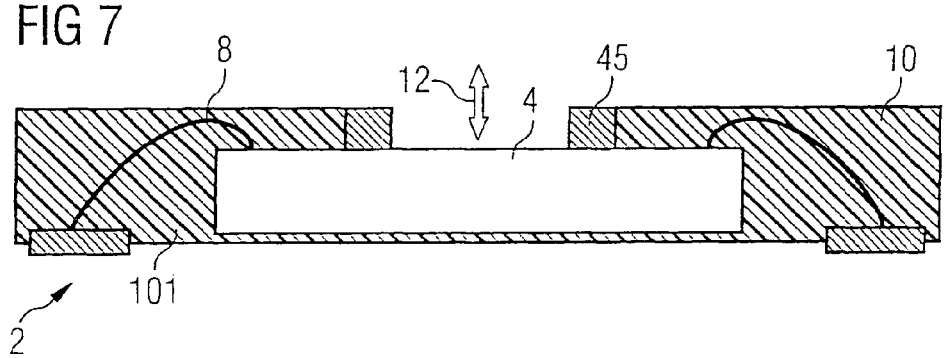
FIG. 7 shows the electronic semiconductor device in accordance with FIG. 6 in a diagrammatic sectional illustration.

As can be discerned from the diagrammatic sectional illustration of FIG. 7, the plastic housing 10 adjoins as far as the outer edge of the metal frame 45 and leaves free the active chip area 47 for sensor and/or actuator signals 12 to be coupled in and out in an unimpeded manner. The contact areas 43 of the semiconductor chip 4 are connected via wire bonding connections 8 to contact pads 66 of the carrier substrate 6 which lead to external contacts 67.

A method according to the invention for producing an electronic semiconductor device 2 having a semiconductor chip 4 is illustrated with reference to FIGS. 1 to 7. Firstly, a semiconductor chip 4 having an active front side 41 and an active chip area 47 and contact areas 43 grouped around the latter and having a passive rear side 42 is provided. Then, an elevated metal frame 45 is applied to the active front side 41. Next, electrical connections between the contact areas 43 of the semiconductor chip 4 and contact pads 66 of the semiconductor device 2 are produced. Finally, a housing 10 of the semiconductor device 2 is applied while leaving external contacts 67 and while leaving external contacts 67 and the active chip area 47 within the metal frame 45 open or exposed.

The metal frame is, for instance, applied galvanically to the active front side 41 of the semiconductor chip 4. The metal frame 45 may be applied in a common process step together with the contact bumps 46.

The semiconductor chip 4 may either be connected to a carrier substrate 6 using flip-chip technology, in which case, a cutout 63 or a deflection device 68 for signal routing purposes can be provided. As an alternative, the semiconductor chip 4 may also be mounted using known wire bonding technology. In this case, a corresponding sensor channel 102 in the plastic housing 10 can be provided. The sensor channel can be produced, for example, by applying the molding composition 101 of the plastic housing 10 as far as the outer edge of the metal frame 45.

The above description of the exemplary embodiments in line with the present invention serves merely for illustrative purposes and not to limit the invention. The invention allows various changes and modifications without departing from the scope of the invention and its equivalents:

I claim:

1. An electronic semiconductor device, comprising:
a semiconductor chip including: an active front side; at least one active chip area disposed on the active front side and functioning as a sensor and/or actuator surface; an elevated metal frame extending from the active front side and surrounding the at least one active chip area; and contact areas disposed on the active front side of the semiconductor chip exterior to the elevated metal frame; and a plastic housing including a cutout for the active chip area within the metal frame, the cutout permitting passage of signals to and/or from the at least one active chip area.

2. The electronic semiconductor device as claimed in claim 1, wherein the metal frame has an annular form with a rectangular cross section.

3. The electronic semiconductor device as claimed in claim 1, wherein a top side of the metal frame terminates flush with a surface of the plastic housing.

4. The electronic semiconductor device as claimed in claim 1, wherein the semiconductor chip is mounted by its active front side on a carrier substrate using flip-chip technology, the carrier substrate having a coupling-in location for sensor signals and/or a coupling-out location for actuator signals.

5. The electronic semiconductor device as claimed in claim 1, wherein the semiconductor chip is mounted by a passive rear side on the carrier substrate, which has contact pads that are electrically conductively connected by wire bonding connections to the contact areas on the active front side of the semiconductor chip.

6. The electronic semiconductor device as claimed in claim 1, wherein the active chip area has an optically sensitive area.

7. The electronic semiconductor device as claimed in claim 1, wherein the active chip area has an optically active surface region.

8. The electronic semiconductor device as claimed in claim 1, wherein the active chip area has a pressure sensitive area.

9. The electronic semiconductor device as claimed in claim 1, wherein the active chip area has an area that is sensitive to sound oscillations.

10. The electronic semiconductor device as claimed in claim 1, wherein the active chip area has a temperature sensitive area.

11. The electronic semiconductor device as claimed in claim 1, wherein the active chip area has an area sensitive to specific gases and/or gas mixtures.

12. A method for producing an electronic semiconductor device having a semiconductor chip, which has at least one active chip area functioning as a sensor surface and/or an actuator surface on the active front side, comprising:

providing a semiconductor chip including an active front side and a passive rear side, the active front side including an active chip area and contact areas disposed around the active chip area;

applying an elevated metal frame around the active chip area;

producing electrical connections between the contact areas on the active front side of the semiconductor chip and contact pads of the semiconductor device; and applying a plastic housing of the semiconductor device while leaving external contacts and the active chip area within the metal frame exposed.

13. The method as claimed in claim 12, wherein the metal frame is applied galvanically to the active front side of the semiconductor chip.

14. The method as claimed in claim 12, wherein contact bumps are applied to the contact areas of the semiconductor chip galvanically when applying the metal frame.

15. The method as claimed in claim 12, wherein electrically conductive connections are produced between the contact areas of the semiconductor chip and the contact pads of the carrier substrate by wire bonding connections.

* * * * *